United States Patent [19]

Casper et al.

[11] Patent Number: 5,754,577

[45] Date of Patent: May 19, 1998

[54] COMPENSATION FOR VARIATIONS IN TEMPERATURE AND AGING OF LASER DIODE BY USE OF SMALL SIGNAL, SQUARE-LAW PORTION OF TRANSFER FUNCTION OF DIODE DETECTION CIRCUIT

[75] Inventors: Paul W. Casper, West Melbourne; Arthur Gerard Wilson, Palm Bay, both of Fla.

[73] Assignee: Broadband Communications Products, Inc., Melbourne, Fla.

[21] Appl. No.: 685,440

[22] Filed: Jul. 23, 1996

[51] Int. Cl.[6] .................................. H01S 3/103
[52] U.S. Cl. .................. 372/38; 372/26; 372/29
[58] Field of Search .......................... 372/9, 21, 26, 372/28, 29, 31–34, 38

[56] References Cited

U.S. PATENT DOCUMENTS

| | | | |
|---|---|---|---|
| 4,369,525 | 1/1983 | Breton et al. | 359/187 |
| 4,399,566 | 8/1983 | Roullet et al. | 359/187 |
| 4,504,976 | 3/1985 | Beaudet | 359/187 |
| 4,733,398 | 3/1988 | Shibagaki et al. | 372/31 |
| 4,833,680 | 5/1989 | Kaiser et al. | 372/29 |
| 4,903,273 | 2/1990 | Bathe | 372/38 |
| 5,091,797 | 2/1992 | Proebster | 359/187 |
| 5,153,765 | 10/1992 | Grunziger | 359/180 |
| 5,187,713 | 2/1993 | Kwa | 372/26 |
| 5,309,269 | 5/1994 | Shibao | 359/187 |
| 5,317,443 | 5/1994 | Nishimoto | 359/187 |
| 5,442,510 | 8/1995 | Schwartz et al. | 364/152 |

Primary Examiner—John D. Lee
Attorney, Agent, or Firm—Charles E. Wands

[57] ABSTRACT

A modulation drive current control loop for a digitally modulated laser diode uses the small signal, square-law portion of an RF signal diode detection circuit to adjust the magnitude of laser modulation drive current, and compensate for variations in temperature and aging of the laser diode. Operating the RF signal detector diode as a non-switched device, in its square-law region, provides several advantages over large signal, switched, linear region devices. When a detector diode is operated in the large signal, switched, linear region, its output depends upon the reduced slope beyond the 'knee' region of the curve, so that the diode functions essentially as a switch. In such a large signal detection mode, the diode conducts during only a portion of the input cycle, with its output voltage following peaks of the input signal waveform in accordance with a linear relationship between input voltage and output voltage. This requirement for both a large valued input signal (to overcome the bandgap voltage of the diode) and the need to switch the detector diode on and off necessarily prevents its use with precision at very high (e.g., gigabit) data rates. In contrast therewith, the small signal, square-low detector diode of the present invention can easily produce a proportional output voltage at gigabit speeds using a very small amplitude input signal.

23 Claims, 3 Drawing Sheets

COMPENSATION FOR VARIATIONS IN TEMPERATURE AND AGING OF LASER DIODE BY USE OF SMALL SIGNAL, SQUARE-LAW PORTION OF TRANSFER FUNCTION OF DIODE DETECTION CIRCUIT

FIELD OF THE INVENTION

The present invention relates in general to communication systems, and is particularly directed to a new and improved modulation drive current control loop for a digitally modulated laser diode, which uses the small signal, square-law portion of a diode detection circuit to adjust the magnitude of laser modulation drive current, so as to compensate for variations in temperature and aging of the laser diode.

BACKGROUND OF THE INVENTION

FIG. 1 diagrammatically illustrates the general configuration of a digitally modulated, high-switching frequency (2–3 GHz), laser diode transmitter circuit intended for operation over a wide range of temperature variation (e.g., on the order of −40° C. to +85° C.). As shown therein, a serial digital data stream, for example, a high speed synchronous optical network (SONET) data stream having a data rate on the order of 2.5 Gb/s to be transmitted over an optical communication link, such as an optical fiber, is coupled to a data input port 11 of a retiming register (flip-flop) 10.

Retiming register 10 has a clock port 13 coupled to receive a synchronous clock signal that accompanies the input NRZ serial data stream, and a retimed data output port 15, from which a retimed output serial data waveform, having the amplitude and timing of the input serial data stream, is regenerated for application to a laser current driver 20. In an alternative configuration, where the input data stream is of sufficiently high quality that will enable a downstream laser to generate a high quality laser optical output signal, the retiming register may be by-passed with the input serial data stream being coupled directly to an auxiliary data input port 14 to laser current driver 20.

Laser current driver 20 is operative to convert an input data voltage waveform supplied to its data input port 21 into a (laser extinction) switching current used to drive a laser 30, such as a distributed feedback laser diode. Typically, laser diode 30 has a non-linear, optical output versus drive current input transfer function, as shown in FIG. 2. As can be seen from the illustrated characteristic, until the input drive current to the laser reaches some baseline threshold $I_T$ (where the sloped light output portion of the characteristic intersects the x-axis (light output=0)), the laser does not generate an optical output. Once this current baseline is threshold exceeded, however, laser begins to 'lase' and the optical output power of the emitted light beam varies essentially in linear proportion to the drive current.

An examination of the characteristic of FIG. 2 reveals that not only does the baseline threshold $I_T$ of forward current (If) increase with temperature (Tc), but the differential modulation efficiency (slope of the optical output power) decreases as temperature increases. This means that at higher temperatures more drive current is required to produce a given peak-to-peak excursion in the output beam. In addition, the slope of the optical output power curve is a function of the aging of the laser, which is not readily predictable. Because of these variations, it is necessary to incorporate into the laser transmitter some form of drive current adjustment mechanism, which is operative to stabilize the optical output of the laser for such temperature and aging variations. As shown in FIG. 1, such compensation is customarily effected by means of a baseline or threshold current bias control loop, on the one hand, shown at 40, and a modulating drive current control loop, shown at 50, on the other hand.

The baseline or threshold current bias current control loop 40 monitors the operation of the laser 30 and is operative to maintain a minimum or threshold bias current to the current driver 20, such that the optical output of the laser is just at the threshold of optical emission in the absence of any modulation current. As shown in FIG. 2, for an operating temperature Tc=+25° C., this baseline or threshold current $I_T$ is on the order of 13 mA.

To monitor the optical output generated by the laser diode 30, a laser emission-monitoring photodiode is coupled to receive a portion of the light emitted from the laser, for example, by optically coupling the monitoring photodiode to the rear facet of the laser 30. The output of the monitoring photodiode is a D.C. current that is proportional to the emitted optical power. This D.C. current is compared to a baseline current threshold-equivalent reference current, and any difference between the two produces a bias correction current that drives the laser drive bias threshold current to the required baseline operating point.

The modulation drive current control loop 50 is operative to generate a laser modulation switching current, which varies with the input data signal and has an amplitude that produces a prescribed peak-to-peak variation in the optical power output of the laser. As can be seen from the exemplary characteristic in FIG. 2, at +25° C., a 27 mA variation in laser drive current will produce a peak-to-peak optical output variation of approximately 3 mW. However, for a substantial increase in temperature to +70° C., then in order to obtain the same variation in optical output will require nearly a 40 mA peak-to-peak excursion in the modulation drive current. In order to maintain the necessary drive current, the drive current control loop 50 monitors the A.C. signal component of the photocurrent produced by the laser emission-monitoring photodiode, and adjusts the magnitude of the laser driver's switching current, so as to maintain the modulation component of the drive current constant with temperature and aging.

One prior art scheme for providing such modulation current compensation, described in the U.S. Pat. No. 4,369,525 to Breton et al, uses a switched, peak-detector diode that operates in the large signal (switching) mode, to produce a rectified output voltage. This rectified output voltage is then compared with a voltage reference to generate an error signal, which is amplified and fed back to control the drive current. Although such a scheme might possibly work at relatively low data rates, it is neither practical nor necessarily operative at gigabit speeds, since substantial gain-bandwidth product transimpedance amplification is required, in order to raise the sub-milliamp laser emission monitoring photodiode output to the requisite peak-to-peak output voltage. In addition, temperature effects on the rectifying diode's bandgap voltage introduces substantial error.

Other large signal-based switching diode schemes are described in the U.S. Pat. No. 4,399,566 to Rullet et al and U.S. Pat. No. 4,504,976 to Bearudet, the latter being combined with a low frequency pilot tone that is summed with the data modulation signal. The U.S. Pat. No. 5,153,765 to Grunzinger also shows a pilot tone device, which employs a full-wave switching diode to detect the amplified and filtered pilot tone in the monitoring diode output.

Another large signal, switched-diode scheme, described in the U.S. Pat. No. 4,733,398 to Shibagaki et al, employs a delayed replica of the input data signal to switch a sampling diode bridge. The laser output monitoring diode signal component is synchronously sampled by a diode bridge during the high state of the pulse, providing an estimate of peak laser modulation. While the Shibagaki et al scheme is fast enough to handle gigabit rate data, it suffers from the very severe disadvantage of requiring a precisely phased high amplitude replica of the electrical data signal in order to drive the sampling diode bridge. Not only must the phase accuracy be down in the low ten's of picoseconds, but it must be stable over the full operating temperature range—uneconomical tasks at gigabit speeds on the order of 2.5 Gb/s. Other examples of prior art synchronous sampling arrangements are described in the U.S. Pat. No. 4,833,680 to Kaiser et al, and the U.S. Pat. No. 5,091,797 to Proebster.

The U.S. Pat. No. 5,309,269 to Shibao describes another technique, that involves the use of a precisely phased, high amplitude replica of the data signal, which is exclusively OR'd with the amplified, logic-level output of the monitoring diode. The exclusive-OR output is indicative of any pulse-width differences caused by pulse-width distortion in the optical output signal. This distortion is regarded as representative of negative modulation peaks extending below the laser turn-on threshold, thereby inducing the well known problem of laser turn-on delay. This implies a low bias condition which is corrected by a closed bias current control loop.

SUMMARY OF THE INVENTION

In accordance with the present invention, the shortcomings of conventional large signal, switched-diode and pilot tone modulation drive current control loop schemes of the type described above are effectively obviated by a reduced complexity modulation drive current control loop, that takes advantage of the substantial multiplying effect produced by the small signal, square-law portion of a diode detector to adjust the magnitude of the laser modulation drive current, so as to compensate for variations in temperature and aging of the laser.

As in the transmitter architecture of FIG. 1, described above, the laser current driver to which the modulation control loop of the present invention is coupled is operative to convert a serial data input voltage supplied to its data input port into a modulating, laser-extinction control current that drives a laser diode. The magnitude of the modulation drive current output by the laser current driver is defined in accordance with a magnitude or peak-to-peak control voltage supplied to its magnitude control port. The laser current driver outputs a modulated laser drive current that is summed with a threshold DC bias current from a threshold bias current control loop, causing the laser diode to generate an optical output (coherent light beam). Thus, the light beam emitted by the laser diode has a frequency component corresponding to the data signal component of the laser modulation current signal and a peak-to-peak optical power excursion defined in accordance with the response of the laser's non-linear optical output power versus laser drive current transfer function to the magnitude of the modulating laser drive current.

The bias current control loop is driven by the DC current component in the detected output current signal generated by a laser emission-monitoring photodiode. Because of the nature of the power spectrum of a randomized data signal, the output of the photodiode is stable regardless of the data pattern in the data. This allows the use of a relatively low cost photodiode having a frequency response that passes only a portion of the data signal's power density spectrum.

The output current generated by the monitoring photodiode is coupled a current-to-voltage converter. The AC component of the converted voltage signal is AC-coupled to an RF amplifier, which produces an amplified output voltage that is AC-coupled to a square law-based rectifier circuit. The power level of the RF amplifier is set at a value to insure that a downstream square law-based rectifier circuit operates in the small signal, square-law mode.

The square law-based rectifier circuit comprises a pair of small signal, non-switched, square-law detector diodes, which may be operated either unbiased or with a small forward bias for increased sensitivity. One of these detector diodes is coupled to the output of the RF amplifier and is operative to generate a first rectified output voltage in accordance with the square of or power in the amplified AC output voltage. A second detector diode is used to generate a second reference voltage in accordance with the square of, or power in, a reference current $I_{REF}$ supplied thereto, which is representative of a prescribed optical output power to be generated by the laser diode for a predetermined value of operating temperature.

The outputs of the two square law detector diodes are coupled to respective inputs of a differential integrator, which generates a DC output voltage that is proportional to the difference between the rectified output voltage from the first non-switched detector diode, and a second input voltage derived from the second detector diode that produces a reference voltage derived from a summation current derived from a reference current $I_{REF}$ generated by a reference current generator and a tracking current $I_{TRACK}$ generated by a tracking current generator.

The reference current $I_{REF}$ generated by the reference current generator is representative of a prescribed optical output power to be generated by the laser diode for the predetermined value of operating temperature, and is used to set the magnitude control voltage applied to the laser driver, such that its output drive current will produce the desired peak-to-peak excursion in the laser diode's optical output in accordance with the response of the laser's non-linear optical output power versus laser drive current transfer function. Then, as the temperature changes or the laser ages, its monitored optical output power will change from its pre-established value, as initially determined by the value of the reference current $I_{REF}$, creating a non-null condition across the inputs to the differential integrator. The differential integrator responds by changing the value of the magnitude control voltage to return its inputs to a null condition.

The tracking current $I_{TRACK}$ generated by the tracking current generator is representative of the tracking error in the output current generated by the monitoring photodiode for a particular manufacturer's laser diode. It is not uncommon for the tracking error to be as much as ±1 dB over a −40 ° C. to +85° C. temperature range. To effectively compensate for this tracking offset, the behavior of the monitoring photodiode is measured empirically for variation in temperature over the full operating range of the transmitter, and a prescribed compensation resistor is employed to generate a thermally sensitive 'tracking' current $I_{TRACK}$, which is summed with the reference current in the reference detector diode circuit.

With each of the detector diodes operating in its small signal or square-law region of its input/output rectification transfer function, the RF output detector diode will produce a (rectified) output voltage that is equal to the square of the input current applied to a photo-current to voltage-converting resistor at the input of the RF amplifier. Since the photo current produced by monitoring photodiode is proportional to the optical power emitted by laser diode, then the output voltage produced by this small signal detector diode is proportional to the square of this optical power.

Operating the RF signal detector diode as a non-switched device, in its square law region, provides several advantages over large signal, switched, linear region devices employed in the above-described prior art peak-detector systems. When a detector diode is operated in the large signal, switched, linear region, its output depends upon the reduced slope beyond the 'knee' region of the curve, so that the diode functions essentially as a switch. In such a large signal detection mode, the diode conducts during only a portion of the input cycle, with its output voltage following peaks of the input signal waveform in accordance with a linear relationship between input voltage and output voltage. This requirement for both a large valued input signal (to overcome the bandgap voltage of the diode) and the need to switch the detector diode on and off necessarily prevents its use with precision at very high (e.g., gigabit) data rates. In contrast therewith, the detector diode of the present invention is operated in its small signal or square-law region, so that it can easily produce a proportional output voltage at gigabit speeds using a very small amplitude input signal.

DETAILED DESCRIPTION

Figure 1:
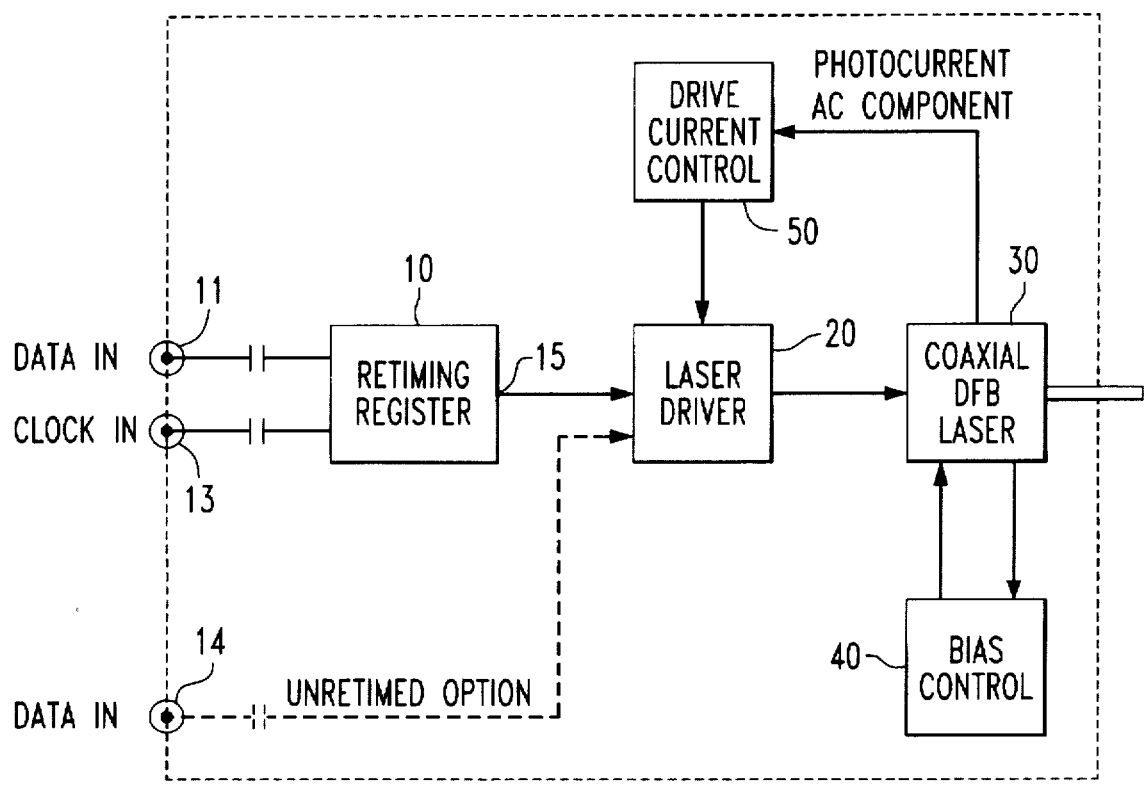
FIG. 1 diagrammatically illustrates the general configuration of a digital, high-switching frequency laser transmitter.
Figure 3:
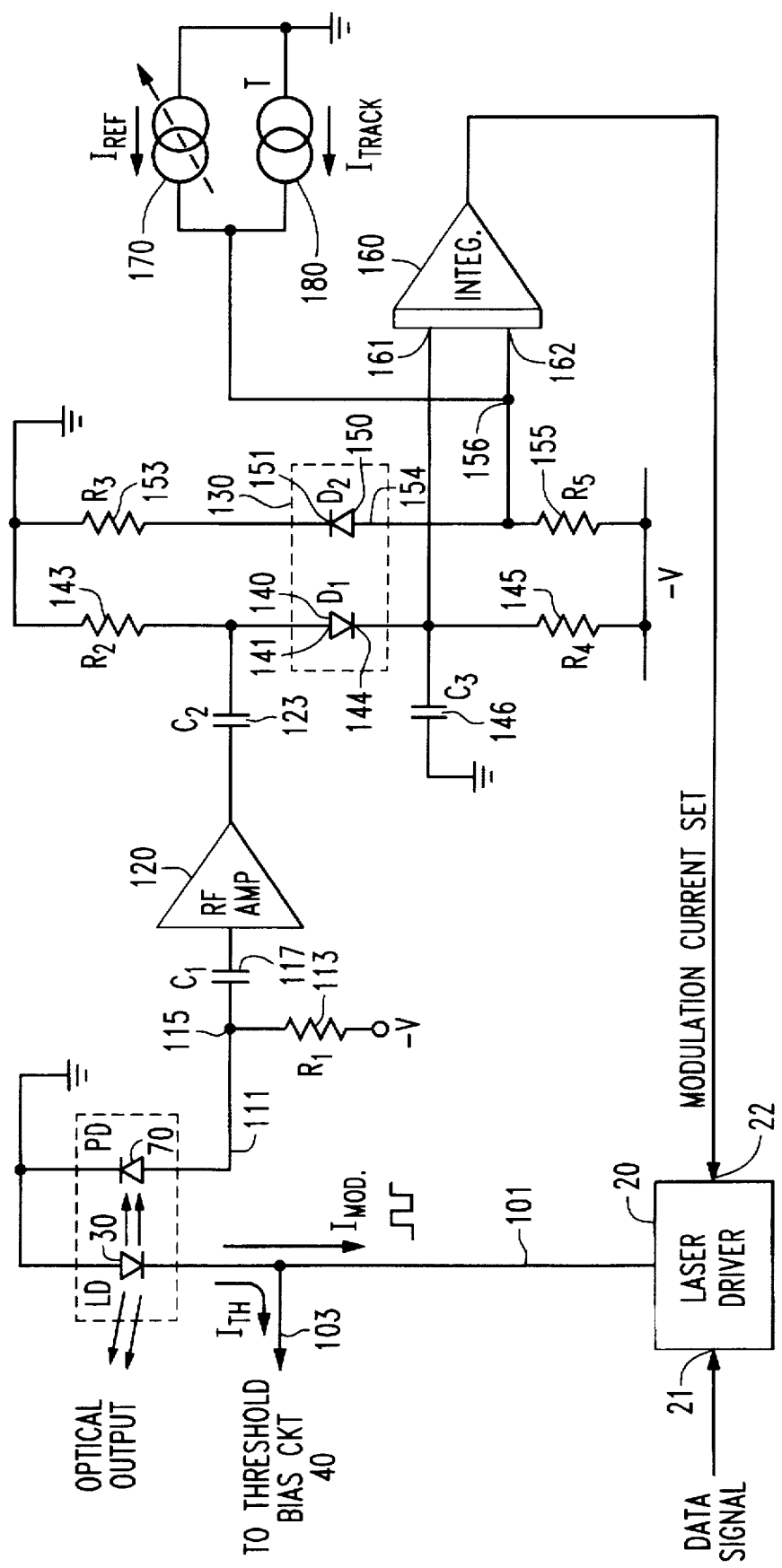
FIG. 3 diagrammatically illustrates the circuit configuration of a laser drive current control loop in accordance with a preferred embodiment of the present invention.

FIG. 3 diagrammatically illustrates the circuit configuration of a laser drive current control loop in accordance with a preferred embodiment of the present invention, which is to be employed in the modulation current control loop 50 of a laser transmitter arrangement having a general configuration shown in FIG. 1, described above. As noted previously, and as will be described in detail below, the improved, reduced complexity modulation drive current control loop of the present invention uses the small signal, square-law portion of a diode detection circuit to adjust the magnitude of the laser modulation drive current produced by laser current driver 20, and thereby compensate for variations in temperature and aging of the laser.

More particularly, as pointed out above with reference to the overall laser transmitter architecture of FIG. 1, the laser current driver 20 is operative to convert a serial data input voltage supplied to its data input port 21 into a modulating, laser-extinction current that switches the optical beam emitted by the laser 30 in accordance with the data signal. The magnitude of this switching or modulating current output by the laser current driver 20 is established by a magnitude control DC voltage supplied to its magnitude control port 22.

In response to these two inputs—the data signal at port 21 and the magnitude control voltage at port 22—laser current driver 20 outputs a modulated laser drive current $I_{MOD}$ over line 101, that rides on top of a baseline or threshold DC bias current $I_{TH}$ supplied over line 103 from bias current control loop 40. The DC bias current $I_{TH}$ is dot-OR'd at 105 with the modulating current $I_{MOD}$, into a composite drive current that causes laser diode 30 to generate an optical output (coherent light beam). The light beam emitted by laser 30 has a frequency component corresponding to the data signal component of the laser modulation current signal and a peak-to-peak optical power excursion, that is defined in accordance with the response of the laser's non-linear optical output power versus laser drive current transfer function to the magnitude of the modulating laser drive current.

Bias current control loop 40 is conventional, and is driven by the DC current component in the detected output current signal generated by a laser emission-monitoring photo diode 70, which is preferably coupled to receive light emitted from the rear facet of the laser 30. As described briefly above, the frequency response of monitoring photodiode 70 is typically such that it passes only a portion of the data signal's power density spectrum, for example, components below about 300 MHz, which are subsequently converted to a DC voltage by a downstream RF detector diode, to be described. This ability to use only a portion of the output power spectrum is due to the fact that the monitoring photodiode 70 produces an output signal power that is stable regardless of the data pattern in the input data signal, it being understood that the data pattern is non constant or sufficiently randomized, as is customary practice in digital communication systems.

Figure 4:
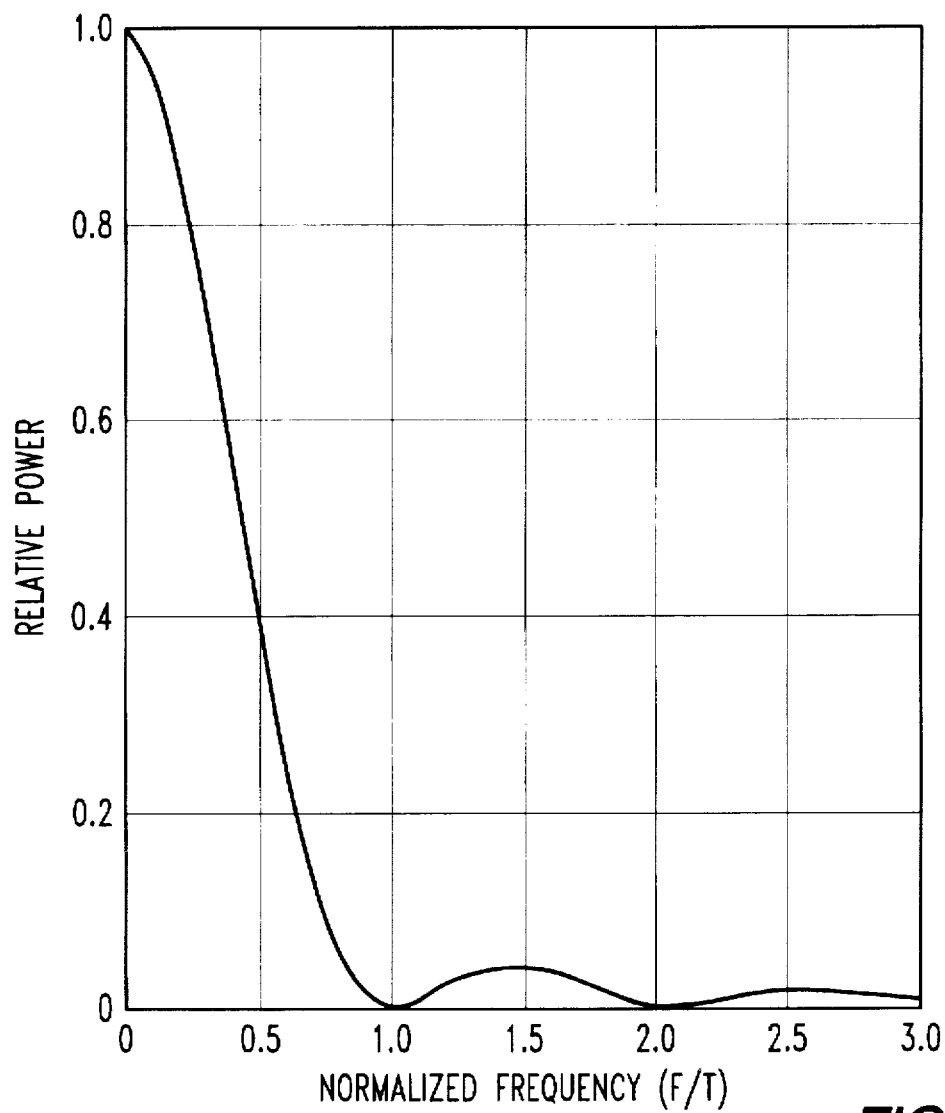
FIG. 4 diagrammatically illustrates the $(sinx/x)^2$ power density spectrum of a scrambled data signal.

For SONET and SDH signals, the data is scrambled and therefore effectively randomized, so as to be independent of the true data pattern. As diagrammatically illustrated in FIG. 4, scrambled data has a predictable $(sinx/x)^2$ power density spectrum. This stable, predictable spectral density characteristic means that only a (filtered) portion of the spectrum can be supplied to a small signal detector diode whose output is proportional to the overall peak-to-peak modulation level. This allows the use of a relatively low cost photodiode having a frequency response that passes only a portion of the data signal's power density spectrum.

For further information regarding such stable, predictable spectral density characteristic of randomized/scrambled data, attention may be directed to the following documentation. Miller, H. 'Bit Sequence Independence Through Scramblers in Digital Communication System', NACHRICHTENTECH. Z., 1974, 12, pp. 475–479; Kasai, H., Senmoto, S., and Matsushita, M., 'PCM Jitter Suppression by Scrambling', IEEE Trans., 1971, COM-22, pp. 1114–1122; Giltin, R. D., and Hayes, J. F., 'Timing Recovery and Scramblers in Data Transmission', BELL SYSTEM TECH. J., 1975, 54, pp. 569–593; Cariolaro, G. I. and Tronca, G. P., 'Spectra of Block Coded Digital Signals', IEEE Trans., 1974, COM-22, PP. 1555–1563; Petrovic, G., 'Spectra of Balanced Digital Signal Generated by Markov Source', ELECTRON. LETT., 1979, 15, pp. 769–770; and Varriest, E. and Hellman, M., 'Convolutional Encoding for Wyner's Wiretap Channel', IEEE Trans., 1979, IT-25, pp. 234–236.

As described previously, comparator circuitry (not shown) within the bias current control loop 40 compares the D.C. current component of the detected output signal from the monitoring photodiode 70 with a baseline current threshold-equivalent reference current. The difference between the reference DC current and the measured DC component in the output of the monitoring photodiode 70 provides a bias correction that adjusts the laser drive DC bias or threshold current $I_T$ supplied over line 103 to its required baseline operating point.

Figure 2:
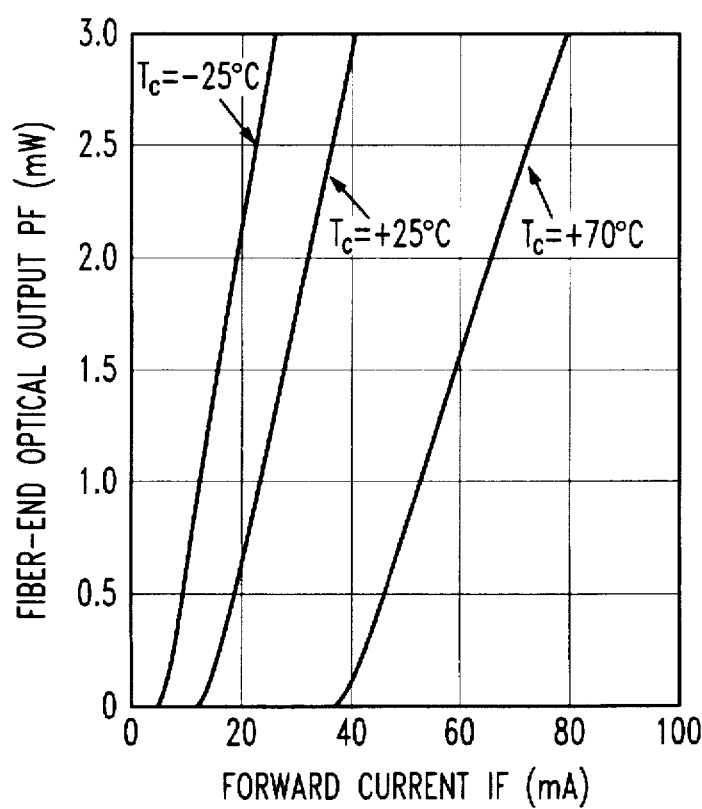
FIG. 2 shows the non-linear optical output versus drive current input transfer function of a laser diode of the type typically employed in the laser transmitter of FIG. 1.

As a non-limiting example, for the transfer function of FIG. 2, at a nominal operating temperature Tc=+25° C., the baseline threshold current is on the order of 13 mA. For a temperature change (e.g., increase), the change (e.g., reduction) in optical power detected in the output beam emitted by the lincreas is used to adjust (e.g., increase) the DC baseline current bias supplied over line 103 to that required at the new (e.g., higher) operating temperature.

The output current generated by monitoring photodiode 70 is coupled over line 111 to a current-to-voltage converter, shown as resistor 113, which is coupled between line 111 and a source of reference potential (−V). The AC component of the converted voltage signal at connection node 115 is AC-coupled through a capacitor 117 to an RF amplifier 120, which produces an amplified output voltage, that is AC-coupled through an output capacitor 123 to a square law-based rectifier circuit 130. The output power level of RF amplifier 120 is typically below −20 dBm, thereby insuring that the rectifier circuit 130 operates in the small signal, square-law mode.

The square law-based rectifier circuit 130 contains a pair of small signal (square-law) detector diodes 140 and 150, which may be operated either unbiased or with a small forward bias for increased sensitivity. In the illustrated example, a small forward bias (e.g., on the order of 20 microamps) is applied to each of the square law detector diodes 140 and 150. Square law-based rectifier circuit 130 is operative to generate a first rectified output voltage in accordance with the square of (power in), the amplified AC output voltage produced by the RF amplifier 120, and a second rectified reference voltage in accordance with the square of a reference voltage representative of a prescribed optical output power to be generated by the laser diode 30 for a predetermined value of operating temperature.

Figure 5:
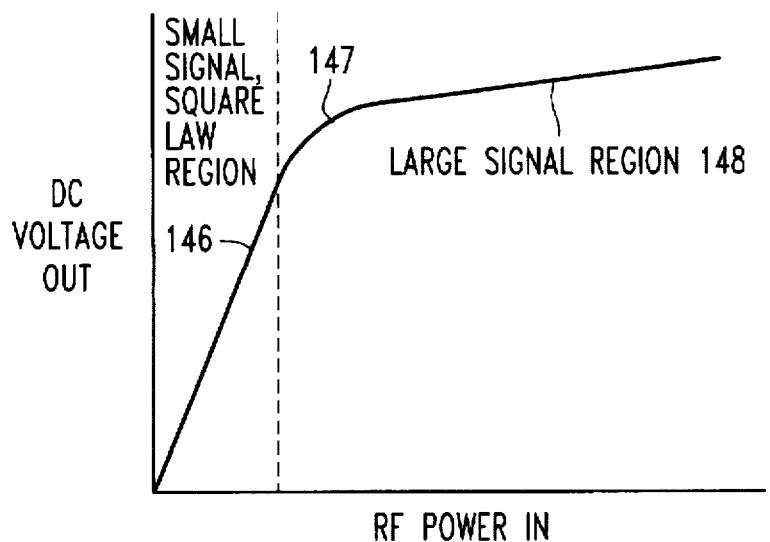
FIG. 5 shows an RF detector diode rectification transfer function.

For this purpose, the first non-switched square law diode 140 is biased to operate in the small signal, square law region of its rectification transfer function, shown at 146 in FIG. 5, and generating a rectified output voltage in accordance with the power in the amplified AC voltage signal produced by RF amplifier 120. Square-law diode 140 has its anode 141 coupled to output capacitor 123 and to a resistor 143 which is coupled to a first reference potential (e.g., ground). The cathode 144 of square law diode 140 is coupled to a resistor 145 which is coupled to a second reference potential (−V), so that the above-referenced small forward bias current is applied to diode 140. This also reduces the RF power requirement from the RF amplifier 120. The cathode 144 of detector diode 140 is also coupled to storage capacitor 146, referenced to ground, which is coupled to a first input 161 of a differential integrator 160. Thus, storage capacitor 146 stores a voltage representative of the current flowing into resistor 145.

The second, non-switched square-law (reference) diode 150 is identical to diode 140, and is preferably being mounted in a common package with detector diode 140, so as to thermally track diode 140. Diode 150 also operates in the small signal, square law region 146 of the rectification transfer function, as shown in FIG. 5, referenced above, and generates a DC output voltage in accordance with the power in a forward current flowing through the diode and into a reference resistor 155. Square law reference detector diode 150 has its anode 151 coupled to a resistor 153 which is coupled to the first reference potential (ground), and its cathode 154 coupled to resistor 155 which is coupled to the second reference potential (−V), so that a small forward bias current is applied to diode 150. The cathode 154 of reference diode 150 is further coupled to a second input 162 of differential integrator 160.

Differential integrator 160 is operative to generate a DC output voltage that is proportional to the integral of the difference between the rectified output voltage applied to its first input 161 from the first non-switched detector diode 140 and a second input voltage coupled to its second input from the node 156 at the connection of cathode 154 of the second detector diode 150 to resistor 155, which is coupled to the second reference potential (−V). Summation node 156 is further coupled to a receive a reference current $I_{REF}$ generated by a reference current generator 170, and a tracking current $I_{TRACK}$ generated by a tracking current generator 180.

The reference current $I_{REF}$ generated by the reference current generator 170 is representative of a prescribed optical output power to be generated by the laser diode 30 for the predetermined value of operating temperature. As described above, this reference current is set at a value such that the magnitude control voltage applied to input 22 of laser current driver 20, will establish a predetermined peak-to-peak excursion in the output beam emitted by the laser diode 30, as defined by the response of the laser's non-linear optical output power versus laser drive current transfer function, shown in FIG. 2, referenced above.

Without this reference current generator 170, and with no RF input signal applied to diode 140 from RF amplifier 120, the output of differential integrator 160 would be zero. In response to an RF output signal associated with detected optical signal energy, the output of square-law detector diode 140 would increase. Without a corresponding increase at the output node 156 of the second square-law diode 150, then differential integrator 160 would generate a DC voltage that would drive to zero the output modulation current on line 101 to the laser 20.

In order to provide the desired DC modulation magnitude control voltage that is representative of the prescribed optical output power to be generated by the laser diode for the predetermined value of operating temperature, it is necessary to provide a DC offset or reference current through square-law (reference) diode 150. As described, this reference current $I_{REF}$ is generated by reference current generator 170. The modulation control loop 50 will now generate the necessary magnitude of modulation drive current which results in a differential null between the cathodes of detector diodes 140 and 150, and thereby between the inputs 161 and 162 of differential integrator 160. Then, as the temperature changes or the laser ages, its monitored optical output power will change from its initially preset value, as established by the value of the reference current $I_{REF}$, and creating a non-null condition across the inputs 161 and 162 of differential integrator 160, and changing the value of the magnitude control voltage to return its inputs to a null condition.

As noted earlier, the tracking current $I_{TRACK}$ generated by tracking current generator 180 is representative of the tracking error in the output current generated by the monitoring photodiode 70 for a particular manufacturer's laser diode 20, for changes in temperature, which may be as much as ±1 dB over a −40° C. to +85° C. temperature range. To effectively compensate for this tracking offset, the behavior of photodiode 70 is measured empirically for variation in temperature over the range of interest, and a prescribed compensation resistor is employed to generate a thermally sensitive 'tracking' current $I_{TRACK}$, which is summed with the reference current at node 156.

As described previously with reference to FIG. 5, each of detector diodes 140 and 150 is operated in its small signal or square-law region of its input/output rectification transfer function. As a consequence, detector diode 140, which is coupled to receive the output voltage produced by RF amplifier 120, will produce a (rectified) output voltage that is equal to the square of the input current applied to the photo-current to voltage-converting resistor 113 at the input of RF amplifier 120. Since the photo current produced by monitoring photodiode 70 is proportional to the optical power emitted by laser diode 30, then the output voltage produced by small signal detector diode 140 is proportional to the square of this optical power. Operating detector diode 140 in this square-law region, as a non-switched device, provides several advantages over large signal, switched linear region devices of the prior art peak-detector systems, described above.

More particularly, with reference again to FIG. 5, when operated in its large signal, linear region 148 of its transfer function, the operation of the detector diode is dependent upon the reduced slope beyond the 'knee' region 147 of the curve, so that the diode functions essentially as a switch. In such a large signal detection mode, the diode conducts during only a portion of the input cycle, with its output voltage following peaks of the input signal waveform in accordance with a linear relationship between input voltage and output voltage. This requirement for both a large valued input signal (to overcome the bandgap voltage of the diode) and the need to switch the detector diode on and off necessarily prevents its use with precision at very high (e.g., gigabit) data rates. In accordance with the present invention, however, since the detector diode 140 (and matched detector diode 150) is operated in its small signal or square law region, it can easily produce an accurate proportional output voltage at gigabit speeds using a very small amplitude input signal.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A method of controlling the operation of an energy emitter having a non-linear output versus input transfer function that varies with an ambient parameter comprising the steps of:
    (a) applying a modulation signal to said energy emitter, said modulation signal having a frequency component derived from an information signal and a magnitude component derived from a magnitude control signal, so as to cause said energy emitter to emit output energy having a frequency that varies in accordance with said information signal and an intensity that is defined in accordance with the response of said non-linear output versus input transfer function to said magnitude control signal;
    (b) detecting a portion of said output energy emitted by said energy emitter in step (a) and producing therefrom an output that is proportional to power of said output energy emitted by said energy emitter; and
    (c) generating said magnitude control signal in accordance with a prescribed relationship between said output and a reference quantity representative of a prescribed peak-to-peak excursion of said energy emitted by said energy emitter.

2. A method according to claim 1, wherein step (c) further comprises generating said magnitude control signal in accordance with a compensation quantity associated with a variation in detected output energy due to a variation of said ambient parameter.

3. An apparatus for controlling the operation of an energy emitter having a non-linear output versus input transfer function that varies with an ambient parameter comprising:
    a stimulus modulator which is operative to apply a modulated stimulus to said energy emitter, said modulated stimulus having a frequency component derived from an information signal and a magnitude component derived from a stimulus magnitude control input, so as to cause said energy emitter to emit output energy having a frequency that varies in accordance with said information signal and a peak-to-peak excursion that is defined in accordance with the response of said non-linear output versus input transfer function to said stimulus magnitude control input;
    an output energy detector coupled to said energy emitter and operative to detect a portion of said output energy emitted by said energy emitter and to produce therefrom an output that is proportional to power of said output energy emitted by said energy emitter; and
    a stimulus magnitude control input generator coupled to said output energy detector and operative to generate said stimulus magnitude control input in accordance with a prescribed relationship between said output and a reference quantity representative of a prescribed peak-to-peak excursion of said energy emitted by said energy emitter.

4. An apparatus according to claim 3, wherein said stimulus magnitude control input generator is operative to generate said stimulus magnitude control input in accordance with a compensation quantity associated with a variation in said output produced by said output energy detector for changes in energy emitted by said energy emitter due to a variation of said ambient parameter.

5. An apparatus according to claim 3, wherein said ambient parameter is temperature.

6. An apparatus according to claim 5, wherein said stimulus modulator is operative to apply said modulated stimulus to said energy emitter having a gigabit frequency component.

7. An apparatus according to claim 3, wherein said energy emitter comprises a laser device having a non-linear optical output power versus laser drive current transfer function that varies with said ambient parameter, and wherein said stimulus modulator comprises a laser drive current modulator which is operative to apply a modulated laser drive current to said laser device, said modulated laser drive current having a frequency component derived from said information signal and a magnitude component derived from a magnitude control input, so as to cause said laser device to generate a modulated optical output having the frequency of said information signal and an optical power content that is defined in accordance with the response of said non-linear optical output power versus laser drive current transfer function to said modulated laser drive current, wherein said output energy detector comprises an optical energy detector coupled to detect said optical output generated by said laser device and to produce therefrom an output that is proportional to power of said optical output generated by said laser device, and wherein said stimulus magnitude control input generator comprises a magnitude control input generator coupled to said optical energy detector and being operative to generate said magnitude control input in accordance with a prescribed relationship between said output produced by said optical energy detector and a reference electrical input representative of a prescribed optical output generated by said laser device for a predetermined value of said ambient parameter.

8. An apparatus according to claim 7, wherein said magnitude control input generator is operative to generate said magnitude control input in accordance with a compensation quantity associated with a variation in said output produced by said optical energy detector energy for changes in energy emitted by said laser device due to a variation of said ambient parameter.

9. An apparatus according to claim 7, wherein the range over which said laser device generates output optical power in linear proportion to laser drive current starts at a threshold laser drive current that varies with said ambient parameter.

10. An apparatus according to claim 9, wherein said ambient parameter is temperature.

11. An apparatus according to claim 7, wherein said optical energy detector comprises a monitoring photodiode which is optically coupled to said laser device and is operative to generate an output current in proportion to the detected portion of said optical output generated by said laser device, a current-to-voltage converter which produces an output voltage in accordance with said output current from said monitoring photodiode, an RF amplifier coupled to said current-to-voltage converter and which produces an amplified output voltage, a square law-based rectifier circuit, which is coupled to the output of said RF amplifier and generates a rectified output voltage in accordance with the power in said amplified output voltage, and wherein said magnitude control input generator is operative to generate said magnitude control input in accordance with a prescribed relationship between said rectified output voltage and a reference voltage representative of a prescribed optical output power to be generated by said laser device for said predetermined value of said ambient parameter.

12. An apparatus according to claim 11, wherein said ambient parameter is temperature.

13. An apparatus according to claim 11, wherein said magnitude control input generator comprises an integrating comparator having a first input coupled to receive said rectified output voltage and a second input coupled to receive said reference voltage, and an output coupled to said laser drive current modulator.

14. An apparatus according to claim 13, wherein said second input of said integrating comparator is coupled to receive a compensation voltage associated with a variation in said output current of said monitoring photodiode with said ambient parameter for a particular laser device.

15. An apparatus according to claim 7, wherein said optical energy detector comprises a monitoring photodiode which is optically coupled to said laser device and is operative to generate an output current in proportion to said optical output generated by said laser device, a current-to-voltage converter which produces an output voltage in accordance with said output current, an RF amplifier coupled to said current-to-voltage converter and which produces an amplified output voltage, a first non-switched diode detector operating, in the small signal, square-law region of its rectification transfer function, and being coupled to the output of said RF amplifier and generating a rectified output voltage in accordance with the power in said amplified output voltage, and wherein said magnitude control input generator is operative to generate said magnitude control input in accordance with a prescribed relationship between said rectified output voltage and a reference voltage representative of a prescribed optical output power to be generated by said laser device for said predetermined value of said ambient parameter.

16. An apparatus according to claim 15, wherein said magnitude control input generator includes a reference voltage generator which contains a second non-switched diode detector operating in the small signal, square-law region of its rectification transfer function.

17. An apparatus according to claim 16, wherein said magnitude control input generator further comprises a differential integrator comparator having a first input coupled to receive said rectified output voltage from said first non-switched diode detector and a second input coupled to receive said reference voltage from said second non-switched diode detector, and an output coupled to said laser drive current modulator.

18. An apparatus according to claim 17, wherein said second input of said integrating comparator is coupled to receive a compensation voltage associated with a variation in said output current of said monitoring photodiode with said ambient parameter for a particular laser device.

19. An apparatus according to claim 15, wherein said ambient parameter is temperature.

20. An apparatus according to claim 7, wherein said information signal is a randomized digital data signal.

21. An apparatus for controlling the operation of a laser device having a non-linear optical output versus input current transfer function that varies with temperature, comprising:

a laser current driver which is operative to convert a serial data input voltage supplied to a data input port thereof into a modulating, laser-extinction control current that drives said laser device, wherein the magnitude of the modulation drive current output by said laser current driver is defined in accordance with a peak-to-peak control voltage supplied to a magnitude control port thereof, said laser current driver producing a modulating laser drive current $I_{MOD}$ that is summed with a threshold DC bias current $I_{TH}$ from a threshold bias current control loop, so as to cause said laser device to emit a light beam, said light beam having a frequency component corresponding to the data signal component of said modulating laser drive current and a peak-to-peak optical power excursion defined in accordance with the response of the laser device's non-linear optical output power versus laser drive current transfer function to the magnitude of said modulating laser drive current;

a monitoring optical energy detector producing an output current in proportion to the power in said light beam, said output current being coupled to a current-to-voltage converter, which produces a voltage signal that is coupled to an RF amplifier, which outputs an amplified output voltage;

a square-law based rectifier circuit coupled to receive the amplified voltage output by said RF amplifier, and comprising a pair of small signal, non-switched, square-law detector diodes, one of which is coupled to the output of said RF amplifier and is operative to generate a first rectified output voltage in accordance with the square of the amplified voltage output by said RF amplifier, and a second detector diode which generates a second reference voltage in accordance with the square of a reference current $I_{REF}$ representative of a prescribed optical output power to be generated by said laser device for a predetermined value of operating temperature; and a differential integrator which is coupled to said one and the other of said pair of square law detector diodes and generates said peak-to-peak control voltage that is proportional to the integral of the difference between the rectified output voltage from said one detector diode, and a voltage derived from said other detector diode.

22. An apparatus according to claim 21, wherein said differential integrator is coupled to receive a compensation voltage proportional to a tracking current $I_{TRACK}$ associated with a variation in said output current of said monitoring optical energy detector with temperature for a particular laser device.

23. An apparatus according to claim 21, wherein said serial data input voltage is a randomized digital data signal.

* * * * *

UNITED STATES PATENT AND TRADEMARK OFFICE
CERTIFICATE OF CORRECTION

Page 1 of 3

PATENT NO. : 5,754,577
DATED : May 19, 1998
INVENTOR(S) : Paul W. Casper, et al

It is certified that error appears in the above-identified patent and that said Letters Patent is hereby corrected as shown below:

The title page, showing an illustrative figure, should be deleted and substitute therefor the attached title page.

Delete drawing Fig. 3, and substitute therefor the attached drawing Fig. 3, as shown on the attached page.

Signed and Sealed this

Fifteenth Day of September, 1998

*Attest:*

BRUCE LEHMAN

*Attesting Officer*     Commissioner of Patents and Trademarks

United States Patent [19]
Casper et al.

[11] Patent Number: 5,754,577
[45] Date of Patent: May 19, 1998

[54] COMPENSATION FOR VARIATIONS IN TEMPERATURE AND AGING OF LASER DIODE BY USE OF SMALL SIGNAL, SQUARE-LAW PORTION OF TRANSFER FUNCTION OF DIODE DETECTION CIRCUIT

[75] Inventors: Paul W. Casper, West Melbourne; Arthur Gerard Wilson, Palm Bay, both of Fla.

[73] Assignee: Broadband Communications Products, Inc., Melbourne, Fla.

[21] Appl. No.: 685,440

[22] Filed: Jul. 23, 1996

[51] Int. Cl.$^6$ ........................................ H01S 3/103
[52] U.S. Cl. ........................... 372/38; 372/26; 372/29
[58] Field of Search ........................... 372/9, 21, 26, 372/28, 29, 31–34, 38

[56] References Cited

U.S. PATENT DOCUMENTS

| | | | |
|---|---|---|---|
| 4,369,525 | 1/1983 | Breton et al. | 359/187 |
| 4,399,566 | 8/1983 | Roullet et al. | 359/187 |
| 4,504,976 | 3/1985 | Beaudet | 359/187 |
| 4,733,398 | 3/1988 | Shibagaki et al. | 372/31 |
| 4,833,680 | 5/1989 | Kaiser et al. | 372/29 |
| 4,903,273 | 2/1990 | Bathe | 372/38 |
| 5,091,797 | 2/1992 | Proebster | 359/187 |
| 5,153,765 | 10/1992 | Grunziger | 359/180 |
| 5,187,713 | 2/1993 | Kwa | 372/26 |
| 5,309,269 | 5/1994 | Shibao | 359/187 |
| 5,317,443 | 5/1994 | Nishimoto | 359/187 |
| 5,442,510 | 8/1995 | Schwartz et al. | 364/152 |

Primary Examiner—John D. Lee
Attorney, Agent, or Firm—Charles E. Wands

[57] ABSTRACT

A modulation drive current control loop for a digitally modulated laser diode uses the small signal, square-law portion of an RF signal diode detection circuit to adjust the magnitude of laser modulation drive current, and compensate for variations in temperature and aging of the laser diode. Operating the RF signal detector diode as a non-switched device, in its square-law region, provides several advantages over large signal, switched, linear region devices. When a detector diode is operated in the large signal, switched, linear region, its output depends upon the reduced slope beyond the 'knee' region of the curve, so that the diode functions essentially as a switch. In such a large signal detection mode, the diode conducts during only a portion of the input cycle, with its output voltage following peaks of the input signal waveform in accordance with a linear relationship between input voltage and output voltage. This requirement for both a large valued input signal (to overcome the bandgap voltage of the diode) and the need to switch the detector diode on and off necessarily prevents its use with precision at very high (e.g., gigabit) data rates. In contrast therewith, the small signal, square-low detector diode of the present invention can easily produce a proportional output voltage at gigabit speeds using a very small amplitude input signal.

23 Claims, 3 Drawing Sheets

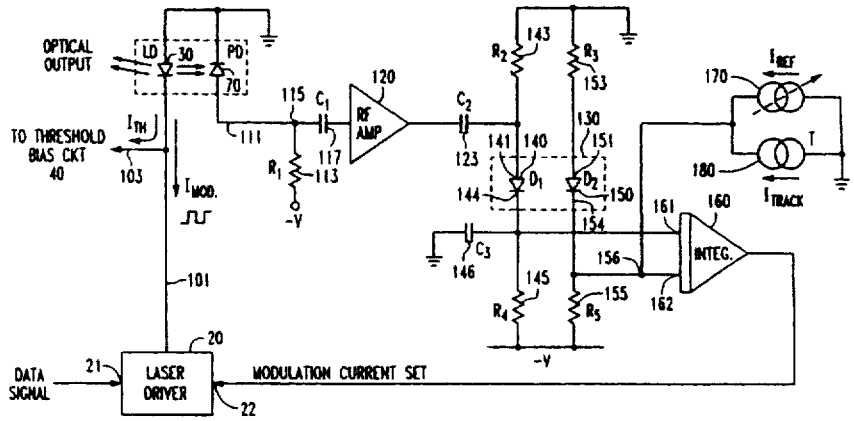

UNITED STATES PATENT AND TRADEMARK OFFICE
CERTIFICATE OF CORRECTION

Page 3 of 3

PATENT NO. : 5,754,577
DATED : May 19, 1998
INVENTOR(S) : Paul W. Casper et al.

It is certified that error appears in the above-identified patent and that said Letters Patent is hereby corrected as shown below:

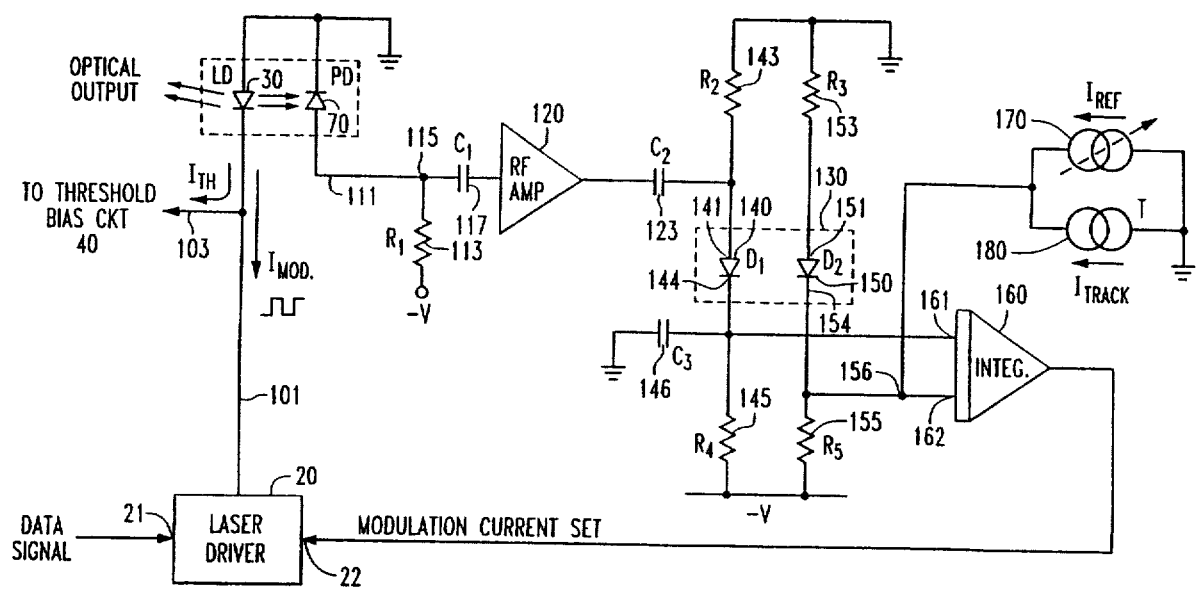

FIG. 3